(12) United States Patent  (10) Patent No.: US 8,520,404 B2
Hamaguchi et al.  (45) Date of Patent: Aug. 27, 2013

(54) FIXING MEMBER FOR FIXING BLINDFOLD PLATE AND METHOD OF FIXING BLINDFOLD PLATE

(75) Inventors: Akihiro Hamaguchi, Kawasaki (JP);
Eichiro Okumura, Kawasaki (JP);
Akira Kikuchi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 111 days.

(21) Appl. No.: 13/197,254

(22) Filed: Aug. 3, 2011

(65) Prior Publication Data

US 2011/0286196 A1  Nov. 24, 2011

Related U.S. Application Data

(63) Continuation of application No. PCT/JP2009/052182, filed on Feb. 9, 2009.

(51) Int. Cl.
*H05K 7/02* (2006.01)
*H05K 7/04* (2006.01)

(52) U.S. Cl.
USPC .................. 361/807; 361/801; 361/803

(58) Field of Classification Search
USPC .......... 361/807, 809, 810, 726, 740, 747, 361/759, 801–803; 174/138 E, 138 G
See application file for complete search history.

(56) References Cited

U.S. PATENT DOCUMENTS

| | | | | |
|---|---|---|---|---|
| 4,358,234 A * | 11/1982 | Takegawa et al. | ........... | 411/80.2 |
| 4,716,633 A * | 1/1988 | Rizo | ................. | 24/453 |
| 5,345,366 A * | 9/1994 | Cheng et al. | ................. | 361/785 |
| 5,406,026 A | 4/1995 | Yamaguchi et al. | | |
| 5,507,610 A * | 4/1996 | Benedetti et al. | ............ | 411/339 |
| 5,658,110 A | 8/1997 | Kraus | | |
| 7,233,503 B2 * | 6/2007 | Chen | ............................ | 361/804 |
| 7,264,501 B1 * | 9/2007 | Lin | ................................ | 439/571 |
| 7,328,489 B2 * | 2/2008 | Leverger et al. | ................ | 24/453 |
| 7,748,089 B2 * | 7/2010 | Jalbert et al. | .................... | 24/297 |
| 7,983,057 B2 * | 7/2011 | Zheng et al. | .................. | 361/810 |

FOREIGN PATENT DOCUMENTS

| | | |
|---|---|---|
| JP | 60-145608 | 9/1985 |
| JP | 61-32609 | 2/1986 |
| JP | 5-114794 | 5/1993 |
| JP | 7-20403 | 4/1995 |
| JP | 8-277820 | 10/1996 |
| JP | 11-68332 | 3/1999 |
| JP | 2007-120679 | 5/2007 |
| JP | 2007-120680 | 5/2007 |

OTHER PUBLICATIONS

International Search Report for PCT/JP2009/052182, mailed Mar. 24, 2009.

* cited by examiner

*Primary Examiner* — Hung S Bui
(74) *Attorney, Agent, or Firm* — Staas & Halsey LLP

(57) ABSTRACT

A fixing member for fixing a blindfold plate to a support post where a fixing hole is formed, the fixing member includes: a deformation portion that is attached to the blindfold plate, and is inserted in to the fixing hole while being deformed and stays in the fixing hole in a deformed condition when the blindfold plate is fixed to the support post.

6 Claims, 23 Drawing Sheets

FIXING MEMBER FOR FIXING BLINDFOLD PLATE AND METHOD OF FIXING BLINDFOLD PLATE

CROSS-REFERENCE TO RELATED APPLICATION

This application is a continuation application of PCT/JP2009/052182 filed Feb. 9, 2009, the contents of which are herein wholly incorporated by reference.

FIELD

A certain aspect of the embodiments discussed herein is related to a fixing member for fixing blindfold plate and a method of fixing a blindfold plate.

BACKGROUND

In recent years, electronic devices such as servers, storages, and network devices are sometimes utilized after being installed in a casing such as a standard casing. A rack such as a casing can house multiple electronic devices, but a vacant area or a vacant space which becomes a blank space where electronic devices are not installed may be sometimes provided. When a cooling method of installed devices is an air cooling by a fan, a concealing panel as a blindfold plate covering a front side of an area which becomes a blank area is fixed to a rack functioning as a casing, and electronic devices are often separately-located in the rack so that the exhaust heat discharged from electronic devices is not drawn into again.

There is an international standard of dimensions relevant to fixing of the rack which are currently known, and most of installed concealing panels adhere to this international standard. More specifically, a width pitch and a height pitch are determined based on the international standard. In addition, when considering the replacement of electronic devices in a rack and the like, it is desirable that a concealing panel is detachable. Conventionally, a method of fixing a concealing panel to a support post by a screw and a method of providing a locking protrusion on a back side of a concealing panel and pushing it in between mount poles located in parallel to each other are widely used under above-described circumstances.

In addition, a joint device, a fixing clip and the like which can be applied for fixing and removing such a concealing panel are proposed. The support post may sometimes be referred to as a mount pole.

[Patent Document 1] Japanese Laid-Open Patent Publication No. 2007-120679

[Patent Document 2] Japanese Laid-Open Patent Publication No. 2007-120680

[Patent Document 3] Japanese Laid-Open Patent Publication No. 11-68332

SUMMARY

According to an aspect of the present invention, there is provided a fixing member for fixing a blindfold plate to a support post where a fixing hole is formed, the fixing member including: a deformation portion that is attached to the blindfold plate, and is inserted in to the fixing hole while being deformed and stays in the fixing hole in a deformed condition when the blindfold plate is fixed to the support post.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A method of fixing a concealing panel to a support post by a screw and a method of providing a locking protrusion on a back side of a concealing panel and pushing it in between mount poles located in parallel to each other are widely used. In addition, a joint device, a fixing clip and the like which can be applied for fixing and removing such a concealing panel are proposed. However, a shape of a fixing hole provided to a mount pole which supports a rack to which a concealing panel is fixed and a plate thickness of a mount pole are not defined in the international standard. As a result, there are several types in the shape of the fixing hole of the rack in the market place, and there are various thickness in the plate thickness of the mount pole.

Under such circumstances, it is difficult to adapt the concealing panel, which is used in a conventional method of pushing a locking protrusion between mount poles, to fixing holes of various shapes and various plate thickness. In addition, problems that the concealing panel after being fixed to the rack tilts forward because of the occurrence of the size difference caused by the low accuracy of the fixing unit and the fixing hole, and the concealing panel slides downward by its own weight occur. In addition, some of above-described techniques are unsuitable for reuse because de-installation is difficult once it is fixed. Furthermore, when a screw is utilized, the tilt and the slide to the downward can be avoided, but the fixing operation requires a lot of work, and there is a problem that the fall, lost, and breakage of the screw occur during the operation.

A description will now be given of embodiments of the present invention with reference to accompanied drawings. In drawings, the size, the ratio and the like of each portion are not illustrated to correspond to actual portions completely. In addition, in several drawings, detail illustration may be omitted.

[First Embodiment]

Figure 1:
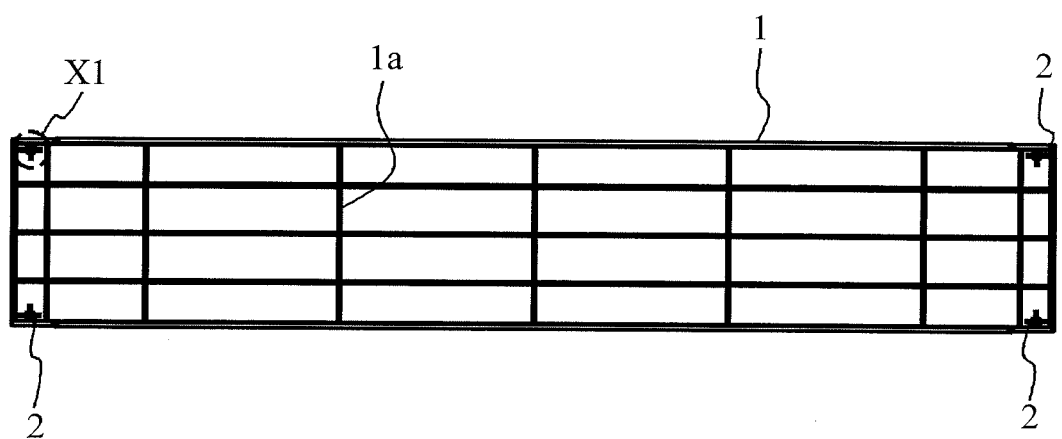
FIG. 1 is a back view of a concealing panel body in accordance with a first embodiment.
Figure 2A:
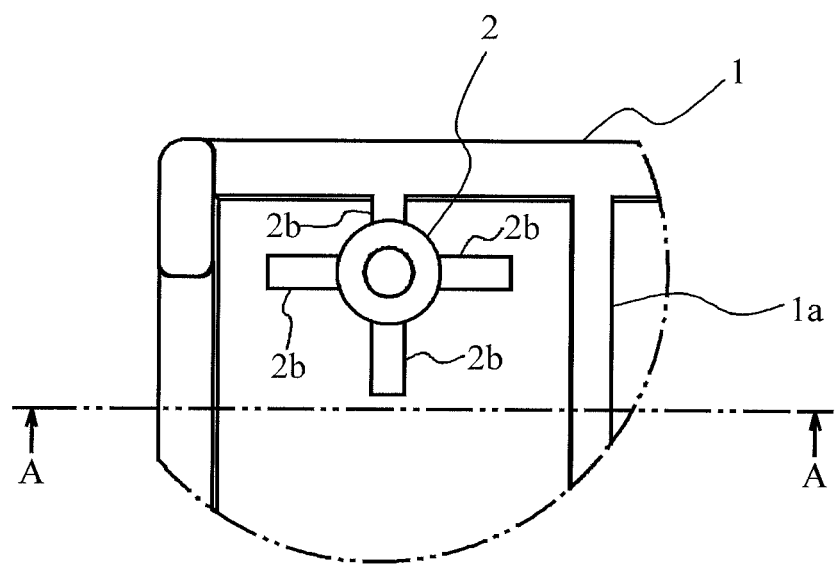
FIG. 2A is an enlarged view of X1 area in FIG. 1.
Figure 2B:
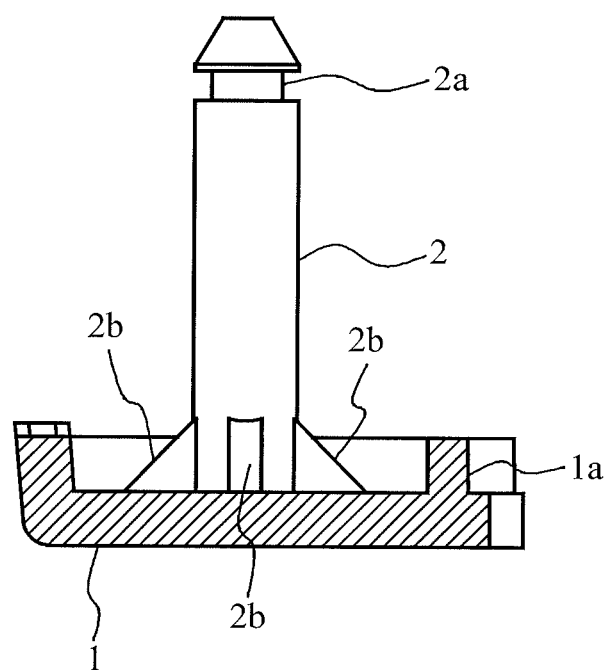
FIG. 2B is a cross-section view taken from line A-A of FIG. 2A.

FIG. 1 is a back view of a concealing panel body 1 as a blindfold plate body in a first embodiment. The concealing panel body 1 has a width pitch and a height pitch based on the international standard. The concealing panel body 1 includes a lattice-shaped reinforcement rib 1a on its back side, and bosses 2 at four corners. FIG. 2A is an enlarged view of X1 area in FIG. 1. FIG. 2B is a cross-section view taken from line A-A of FIG. 2A. A locking groove 2a, to which a small-diameter cylindrical portion 5a provided to a fixing member 3 described later is attached, is provided to a tip end side of the boss 2. In addition, reinforcement portions 2b extending in four directions are provided to a base end side of the boss 2.

The number of bosses 2 varies based on the size of the concealing panel body 1. When the size of the concealing panel body 1 is small, two bosses 2 may be provided to both sides of the concealing panel body 1. In addition, when the size of the concealing panel body 1 is large, further large number of bosses 2 may be provided.

The fixing member 3 illustrated in FIG. 3A through FIG. 3E is attached to the boss 2. The concealing panel body where fixing members 3 are attached to bosses 2 corresponds to a concealing panel 9 in this embodiment.

Figure 3B:
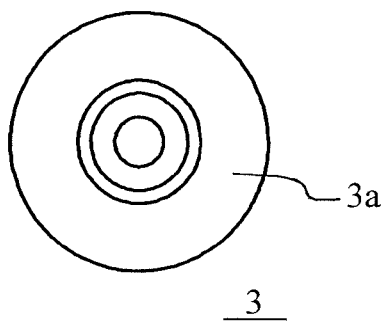
FIG. 3B is a top view of the same.
Figure 3C:
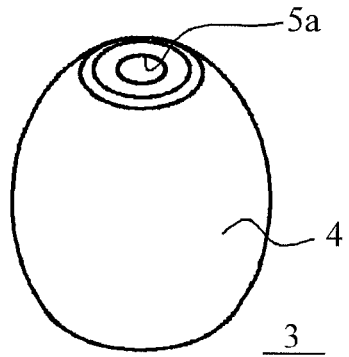
FIG. 3C is a perspective view of the same viewed from a top side.
Figure 3A:
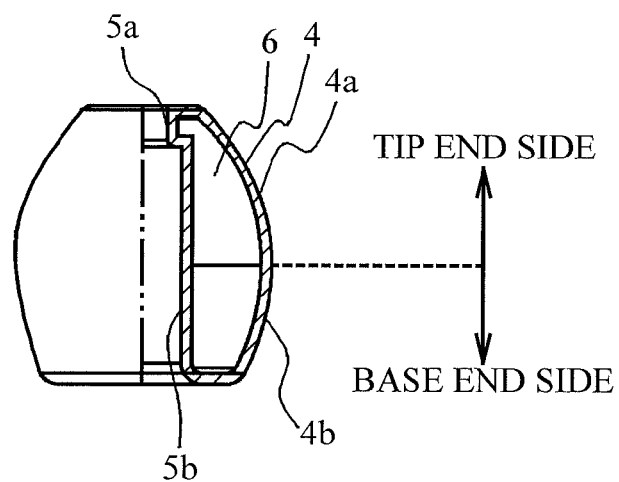
FIG. 3A is a partial cross-section view of a fixing member in the first embodiment.
Figure 3D:
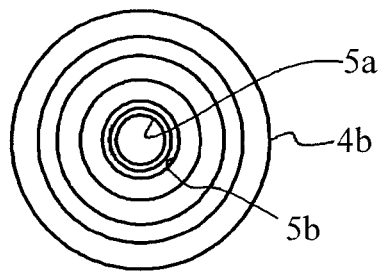
FIG. 3D is a bottom view of the same.
Figure 3E:
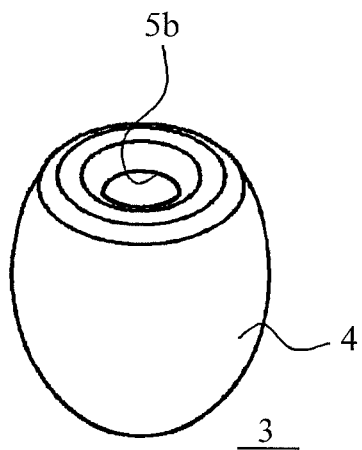
FIG. 3E is a perspective view of the same viewed from a bottom side.
Figure 7:
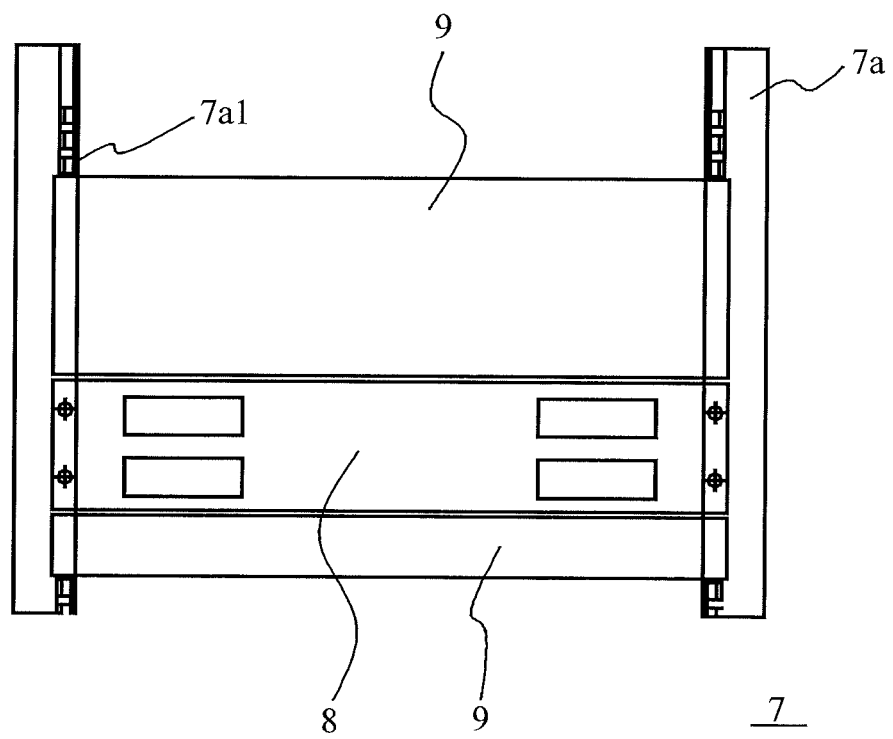
FIG. 7 is a front view of a part of a rack.

FIG. 3A is a partial cross-section view of the fixing member 3. FIG. 3B is a top view of the same. FIG. 3C is a perspective view of the same viewed from a top side. FIG. 3D is a bottom view of the same. FIG. 3E is a perspective view of the same viewed from the bottom side. In addition, FIG. 7 is a front view of part of a rack 7 functioning as a casing. The rack 7 includes a mount pole 7a as a support post. Fixing holes 7a1 are provided to the mount pole 7a at a pitch based on the international standard. The dimension and the shape of the fixing hole 7a1 are not defined in the international standard, and the fixing hole 7a1 may have various shapes, but the fixing hole 7a1 in the rack 7 of the present invention has a square shape.

The fixing member 3 is used when fixing the concealing panel 9 to the mount pole 7a where fixing holes 7a1 are formed. The above-described fixing member 3 is provided with a spherical portion 4 which is inserted into the fixing hole 7a1 while being deformed and stays in the fixing hole 7a1 when fixing the concealing panel to the mount pole 7a. This spherical portion 4 corresponds to a deformation portion in the present embodiment.

The spherical portion 4 which is a deformation portion is inserted into the fixing hole 7a1 while being deformed. Therefore, it is desirable that the fixing member 3 is formed from a material with good flexibility and good resilience. Elastomer may be considered as the material meeting such requirements. The fixing member 3 of the present embodiment is formed from silicon. A whole shape of the fixing member 3 is a spherical shape close to an egg shape as illustrated in FIG. 3A through FIG. 3E. In addition, the fixing member 3 includes the small-diameter cylindrical portion 5a to be attached to the boss 2 and a large-diameter cylindrical portion 5b located next to the small-diameter cylindrical portion 5a. The fixing member 3 is attached to the boss 2 so that the small-diameter cylindrical portion 5a is locked to the locking groove 2a. A space 6 is formed in the inside of the spherical portion 4 provided to the fixing member 3. The deformation of the spherical portion 4 becomes easy because the space 6 is formed. In regard to the outer peripheral shape of the spherical portion 4, the curvature of a tip end side portion 4a which is inserted into the fixing hole 7a1 first is larger than the curvature of a base end side portion 4b. As the outer peripheral shape is made the above-described shape, it becomes possible to make the insertion into the fixing hole 7a1 easy, and improve the stability of the concealing panel 9 fixed to the mount pole 7a. In addition, it is possible to generate a certain level of friction when removing the concealing panel 9.

The spherical portion 4 may have an air hole which communicates the inner space 6 with the outside. The spherical portion 4 inserted into the fixing hole 7a1 shrinks easily because of the provision of the air hole. In addition, the spherical portion 4 after being inserted inhales air into the space 6 from the air hole, and tries to return to its original shape. This makes it possible to fix the concealing panel 9 to the mount pole 7a.

In addition, the spherical portion 4 may be a structure where the space 6 is solid if it can achieve the desired deformation and restoration.

Figure 4:
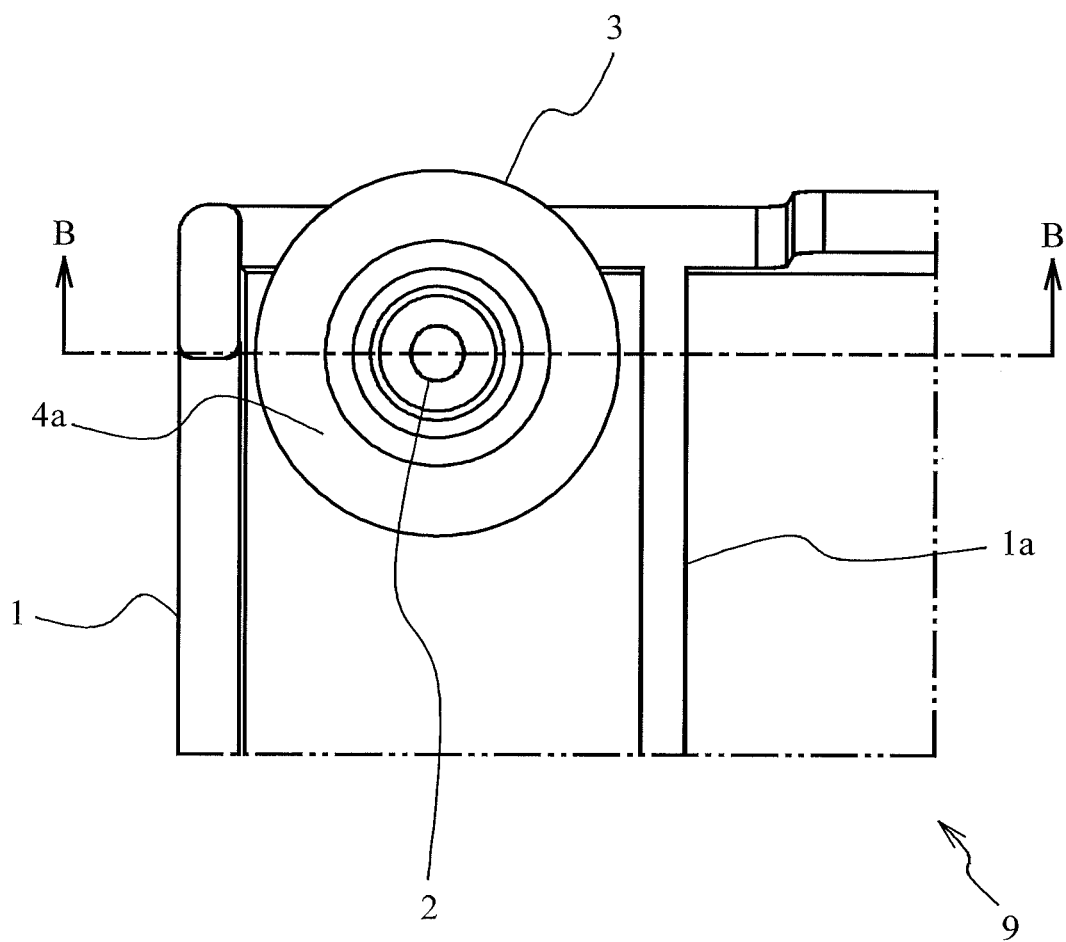
FIG. 4 is an explanatory view of a state where the fixing member is attached to the concealing panel body.
Figure 5:
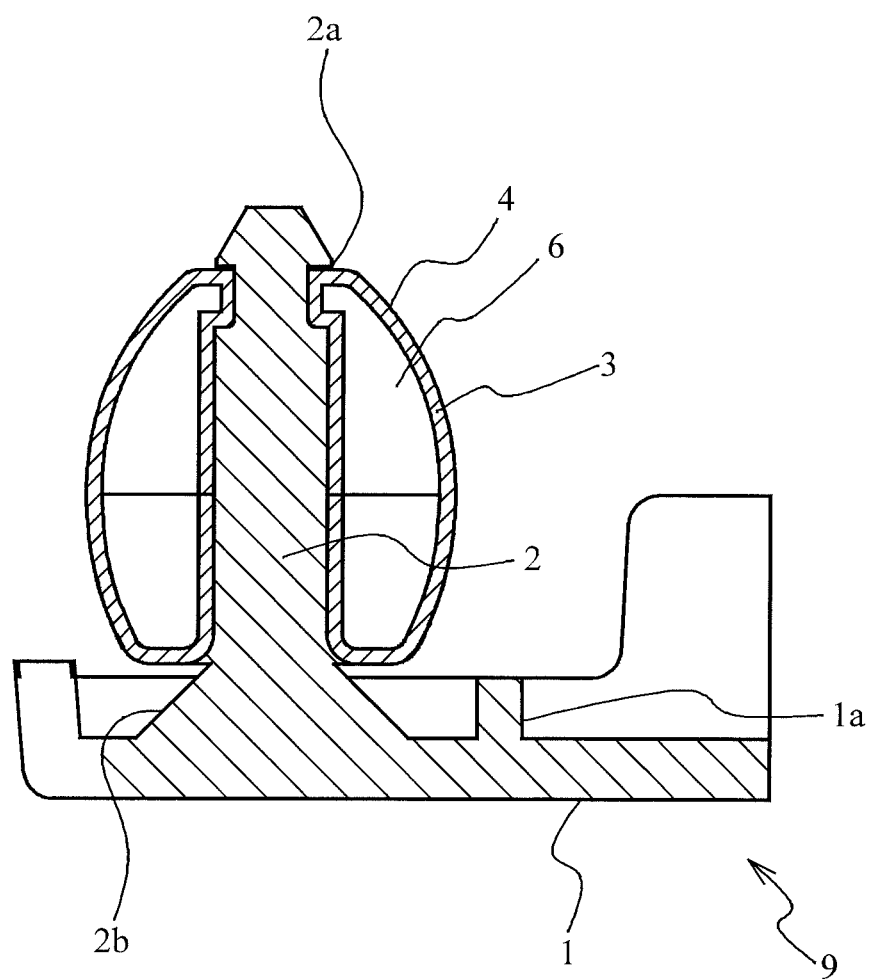
FIG. 5 is a cross-section view taken from line B-B of FIG. 4.
Figure 6:
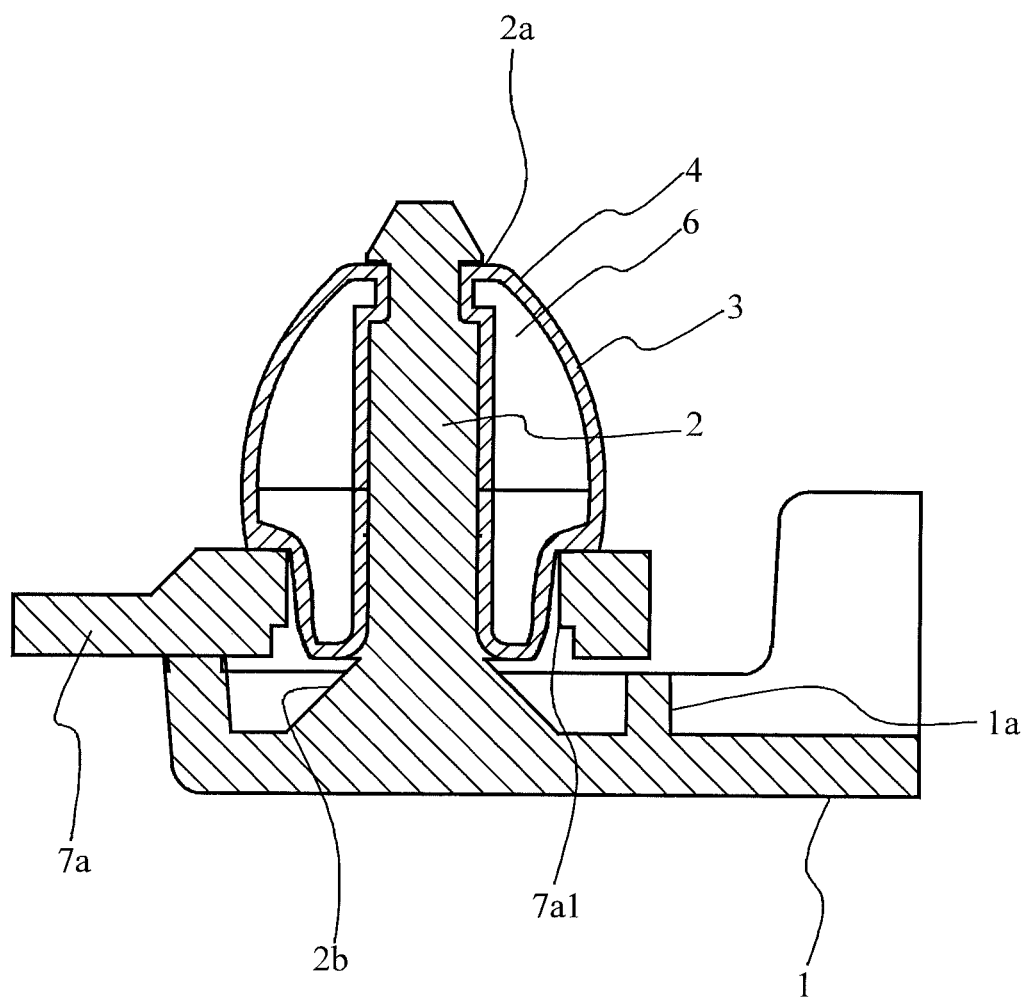
FIG. 6 is an explanatory view of a state where the fixing member is inserted into a fixing hole.

FIG. 4 is an explanatory diagram of a state where the fixing member 3 is attached to the concealing panel body 1. FIG. 5 is a cross-section view taken from line B-B of FIG. 4. In addition, FIG. 6 is an explanatory diagram of a state where the fixing member 3 is inserted into the fixing hole 7a1. FIG. 7 is a front view of the rack 7 as described previously.

The concealing panel 9 formed by attaching the fixing member 3 to the concealing panel body 1 is fixed to the mount pole 7a provided to the rack 7 as illustrated in FIG. 7.

To achieve such a state, firstly, the concealing panel body 1 which is provided with the boss 2 on the back side thereof and the fixing member 3 are prepared, and the state illustrated in FIG. 4 and FIG. 5 is achieved by attaching the fixing member 3 to the boss 2. After that, the position of the boss 2 to which the fixing member 3 is attached is aligned with the position of a desired fixing hole 7a1, and the spherical portion 4 is pushed while being deformed to be crushed. According to this, it is possible to fix the concealing panel 9 to the mount pole 7a easily as illustrated in FIG. 6.

That is to say, if only a state where the spherical portion 4 (the deformation portion) to be inserted into the fixing hole 7a1 is provided on the back side of the concealing panel 9 is achieved, then, the spherical portion 4 is only necessary to be pushed into the fixing hole 7a1 while being deformed. When this operation is performed to four corners of the concealing panel body 1, the fixing operation of the concealing panel 9 is completed. As illustrated in FIG. 6, if the spherical portion 4 is made to stay in the fixing hole 7a1, the spherical portion 4 generates a frictional force against the inner peripheral surface of the fixing hole 7a1 because it tries to return to its original shape so as to fit the shape of the fixing hole 7a1. According to this, the fixed state of the concealing panel 9 is maintained.

A server device 8 which is an example of electronic devices is installed in the rack 7, and a concealing panel is fixed to the front surface of the area other than the area where the server device 8 is installed as illustrated in FIG. 7. The server device 8 is installed by being screwed to fixing holes 7a1 provided to the mount pole 7a.

The server device 8 installed in the rack 7 includes a forced air cooling fan device therein, and the forced air-cooling which takes in air from the front side and exhausts air from the back side is carried out.

A door where exhaust holes which are punching holes are provided is provided on the back side of the rack 7. The exhaust air of the server device 8 is ejected to the outside of the rack 7 through exhaust holes. However, if the concealing panel is not fixed to the rack 7, a part of exhaust air is not easily ejected to the outside of the rack 7 by the pressure generated when exhaust air passes through the exhaust holes. The un-ejected exhaust air generates the air current which comes around in front of the server device 8.

In addition, when the server device 8 and other electronic devices are not fully installed in the rack 7, there is a possibility that the air current with heat of exhaust air comes around in front of the electronic device such as the server device 8 through the area where the electronic devices are not installed. As the electronic device often takes in air from the front, it is concerned that it falls into the vicious cycle that it takes in the exhaust heat which is mixed with air outside of the rack 7 from the front side again.

It is possible to prevent the electronic device such as the server device 8 from taking in the heat of the exhaust air by providing the concealing panel 9 to the front of the area where the electronic devices are not installed as illustrated in FIG. 7. It is possible to avoid the cooling interruption of the electronic device and the noise problem caused by the fast rotation of the forced air cooling fan, which occurs because of the response of the temperature sensor which controls the rotation number of the forced air-cooling fan, by preventing the intake of the heat of the exhaust air.

The above-described concealing panel 9 functions to keep the visual appeal of the appearance of the rack 7 to unify the appearance design of the server device 8.

When there is necessity that an electronic device is newly installed to the area in which the concealing panel 9 is fixed, the concealing panel 9 can be removed easily by being pulled. In addition, when newly fixing it, it can be easily used repeatedly.

As described, if the concealing panel 9 provided with the fixing member 3 is utilized, it is possible to accommodate fixing holes 7a1 of various dimensions and shapes and mount poles 7a of various thickness. In addition, it becomes possible to fix and remove the concealing panel by a simple operation without using tools. In addition, the fixing member 3 can be used repeatedly.

In addition, as the spherical portion 4 can be deformed so as to fit the shape of the fixing hole 7a1, it is expected to suppress the misalignment in fixing, and the backlash. In addition, the spherical portion 4 is expected to fulfill the function of maintaining the stable fixing state by absorbing the vibration energy by the characteristics of the material used for it, converting the vibration energy into the deformation energy that performs the deformation and the restoration instantaneously, and using it.

[Second Embodiment]

A description will now be given of a second embodiment with reference to drawings. The second embodiment is different from the first embodiment in that a fixing member 13 is adopted instead of the fixing member 3 in the first embodiment.

Figure 8:
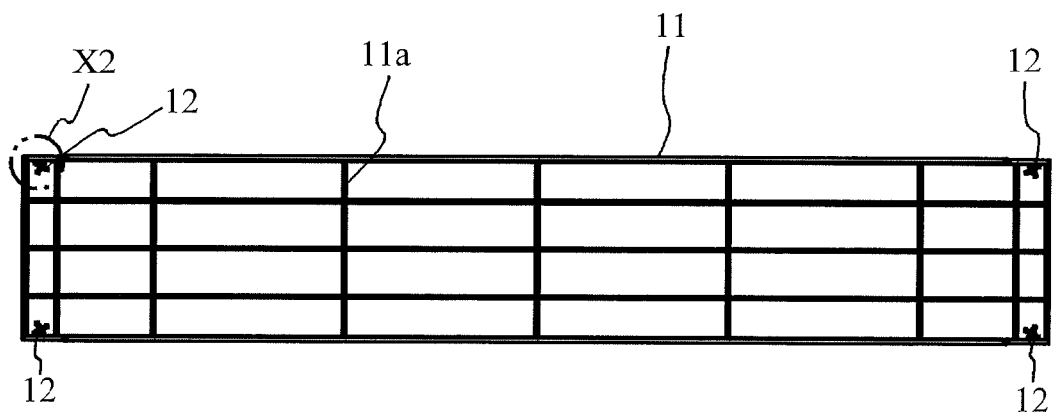
FIG. 8 is a back view of a concealing panel body in accordance with a second embodiment.
Figure 9A:
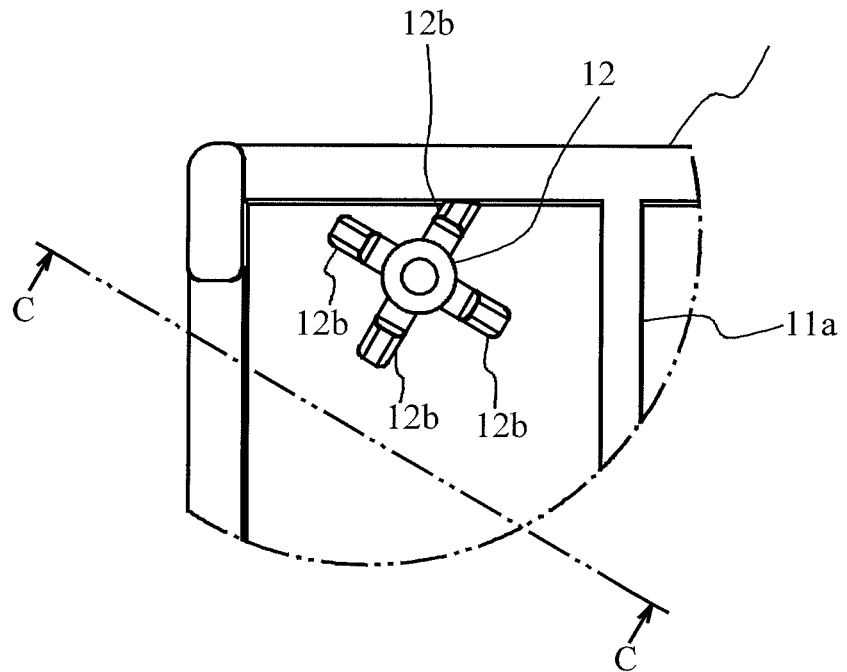
FIG. 9A is an enlarged view of X2 area in FIG. 8.
Figure 9B:
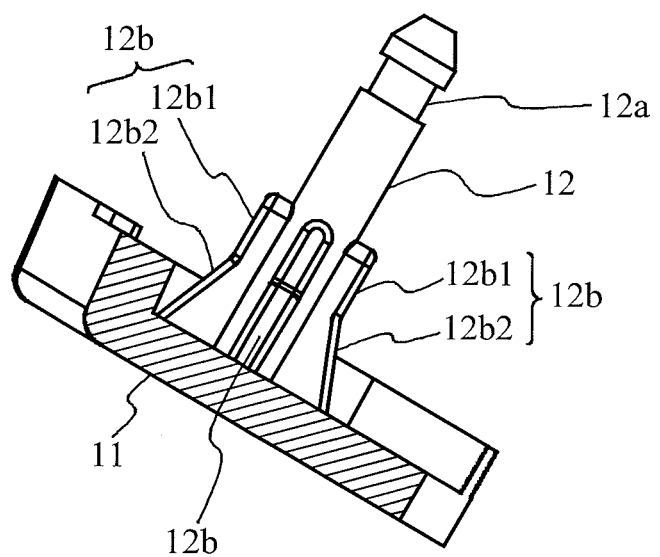
FIG. 9B is a cross-section view taken from line C-C of FIG. 9A.

FIG. 8 is a back view of a concealing panel body 11 in the second embodiment. The concealing panel body 11 has a width pitch and a height pitch based on the international standard in the same manner as the concealing panel body 1 in the first embodiment. The concealing panel body 11 includes a lattice-shaped reinforcement rib 11a on its back side. In addition, bosses 12 are provided to four corners. FIG. 9A is an enlarged view of X2 area in FIG. 8. FIG. 9B is a cross-section view taken from line C-C of FIG. 9A. The tip end side of the boss 12 is provided with a locking groove 12a to which a locking convex portion 16 provided to the fixing member 13 described later is attached. In addition, reinforcement portions 12b extending in four directions are provided to the base end side of the boss 12. The reinforcement portion 12b includes a linear portion 12b1 extending toward the tip end side, and a diameter-expanding portion 12b2 which is located in the base end side and has a folding-fan shape.

The number of bosses 12 varies based on the size of the concealing panel body 11. This is same as the concealing panel body 1 of the first embodiment.

The fixing member 13 illustrated in FIG. 10A through FIG. 10E is attached to the boss 12. The concealing panel body where the fixing member 13 is attached to the boss 12 corresponds to a concealing panel 19 in this embodiment. The concealing panel 19 is fixed to the rack 7 illustrated in the FIG. 7 instead of the concealing panel 9 of the first embodiment.

Figure 10B:
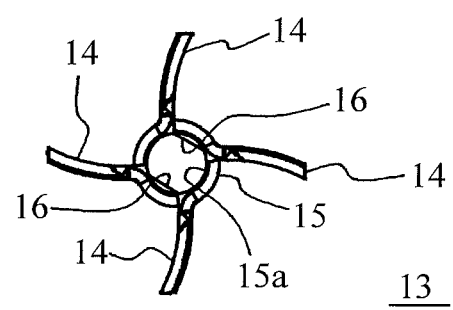
FIG. 10B is a top view of the same.
Figure 10C:
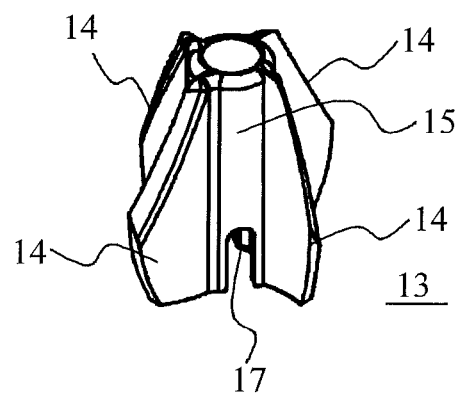
FIG. 10C is a perspective view of the same viewed from a top side.
Figure 10A:
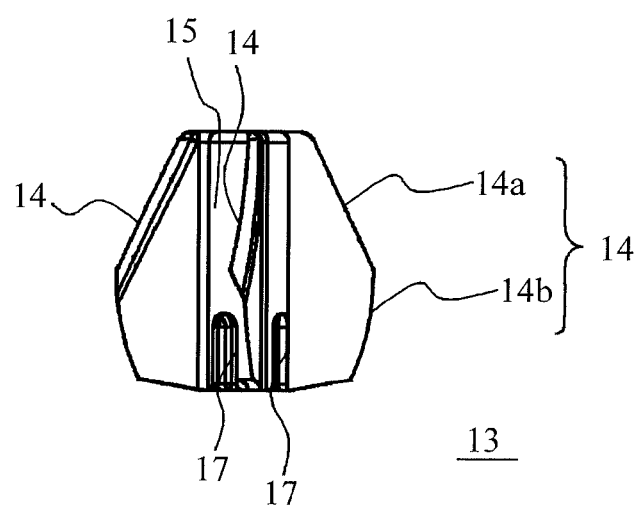
FIG. 10A is a front view of a fixing member in accordance with the second embodiment.
Figure 10D:
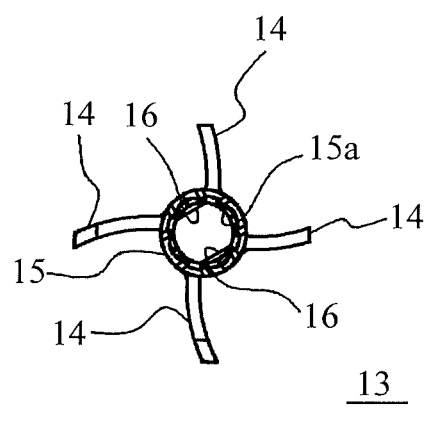
FIG. 10D is a bottom view of the same.
Figure 10E:
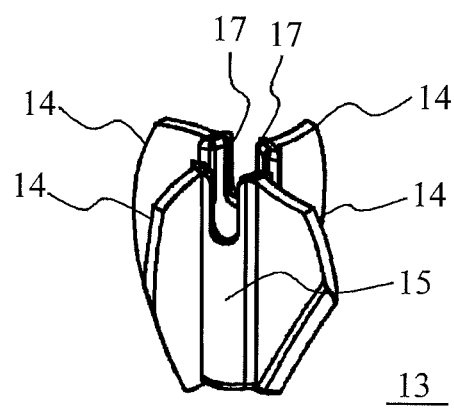
FIG. 10E is a perspective view of the same viewed from a bottom side.

FIG. 10A is a front view of the fixing member 13. FIG. 10B is a top view of the same. FIG. 10C is a perspective view of the same viewed from a top side. FIG. 10D is a bottom view of the same. FIG. 10E is a perspective view of the same viewed from the bottom side.

The fixing member 13 is used when fixing the concealing panel 19 to the mount pole 7a in which fixing holes 7a1 are formed. The fixing member 13 includes vane portions 14 which are inserted into the fixing hole 7a1 while being deformed and stay in the fixing hole 7a1 when fixing the concealing panel 19 to the mount pole 7a. This vane portion 14 corresponds to a deformation portion in this embodiment.

The vane portion 14 which is the deformation portion is inserted into the fixing hole 7a1 while being deformed. Therefore, it is desirable that the fixing member 13 is formed from a material with good flexibility and good resilience. Elastomer may be the material meeting such requirements. The fixing member 13 of this embodiment is formed from silicon. The fixing member 13 includes four vane portions 14 located at even intervals as illustrated in FIG. 10A through FIG. 10E. Four vane portions 14 are subjected to a shape retention treatment so that they curve in same direction. In addition, the fixing member 13 includes a cylindrical portion 15 to be attached to the boss 12. Two locking convex portions 16 are provided to an inside tip end portion 15a of the cylindrical portion 15 so that they face each other. In addition, four locking notch portions 17 are provided to the base end side of the cylindrical portion 15. The locking notch portions 17 are located with being shifted so that they do not cross vane portions 14. In the fixing member 13, locking convex portions 16 are locked to the locking groove 12a, and locking notch portions 17 are attached to the boss 12 so that they are fit with linear portions 12b1. As locking notch portions 17 are fit with linear portions 12b1, the rotation of the fixing member 13 is stopped.

The directions in which reinforcement portions 12b extend are different from those of reinforcement portions 2b in the first embodiment. This intends not to locate positions of vane portions 14 on diagonal lines of the rectangle when the shape of the fixing hole 7a1 is rectangular. When the shape of the fixing hole 7a1 is rectangular, the length of the diagonal line becomes longer than the lengths of sides. Therefore, when vane portions 14 are located on diagonal lines, as they are pulled out from the fixing hole 7a1 easily, this intends to avoid such a situation.

In the vane portion 14, the width of a base end side portion 14b is wider than the width of a tip end side portion 14a as apparent in FIG. 10A. In addition, the edge line of the tip end side portion 14a slopes so that the width broadens as it comes close to the base end side. When the vane portion 14 is inserted into the fixing hole 7a1, the vane portion 14 is pressed against the fixing hole 7a1 along this slope, and is deformed. This makes the insertion to the fixing hole 7a1 easy. On the other hand, the edge line of the base end side portion 14b slopes so that the width becomes narrow as it comes close to the base end side. It is possible to improve the stability of the concealing panel 19 fixed to the mount pole 7a. In addition, it is possible to generate a certain level of friction when the concealing panel 19 is removed.

Figure 11:
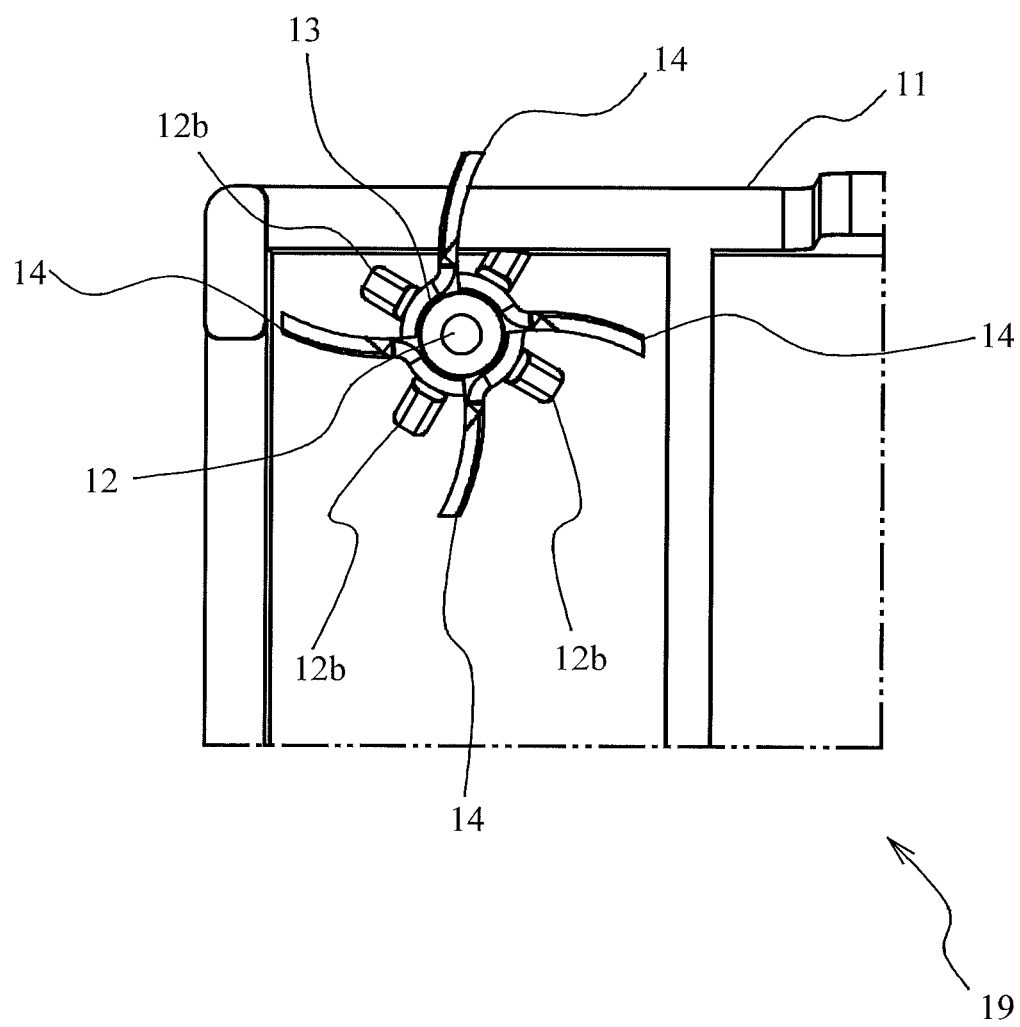
FIG. 11 is an explanatory diagram of a state where the fixing member is attached to the concealing panel body.
Figure 12:
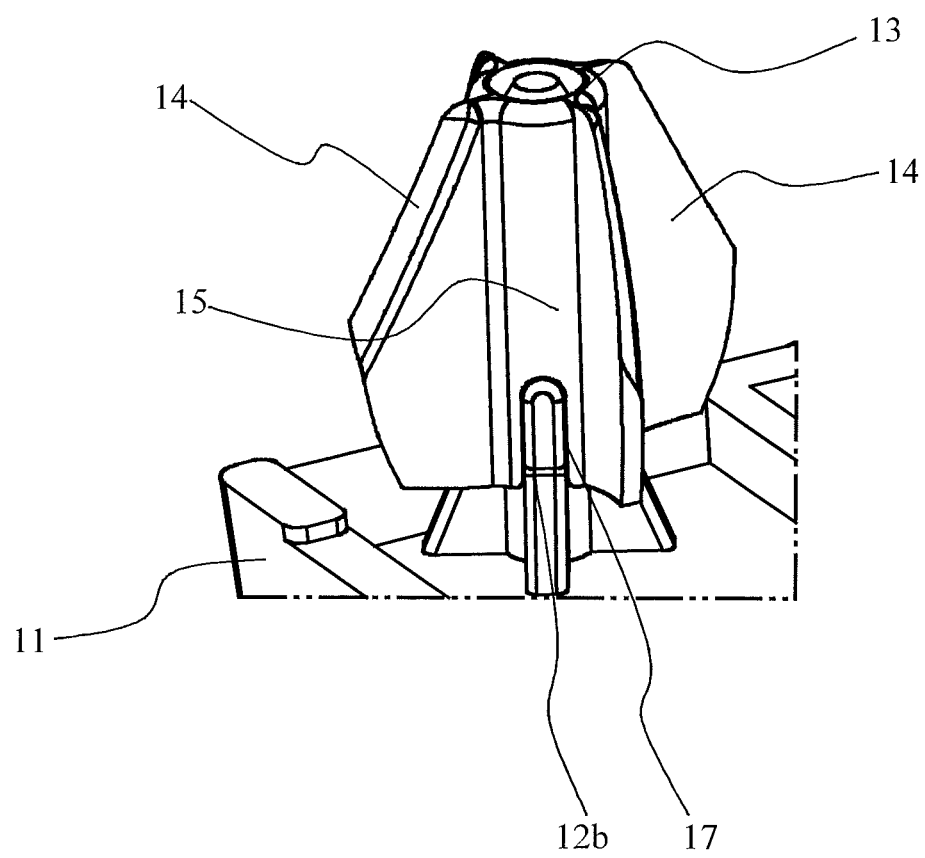
FIG. 12 is a perspective view of the fixing member attached to the concealing panel body.
Figure 13:
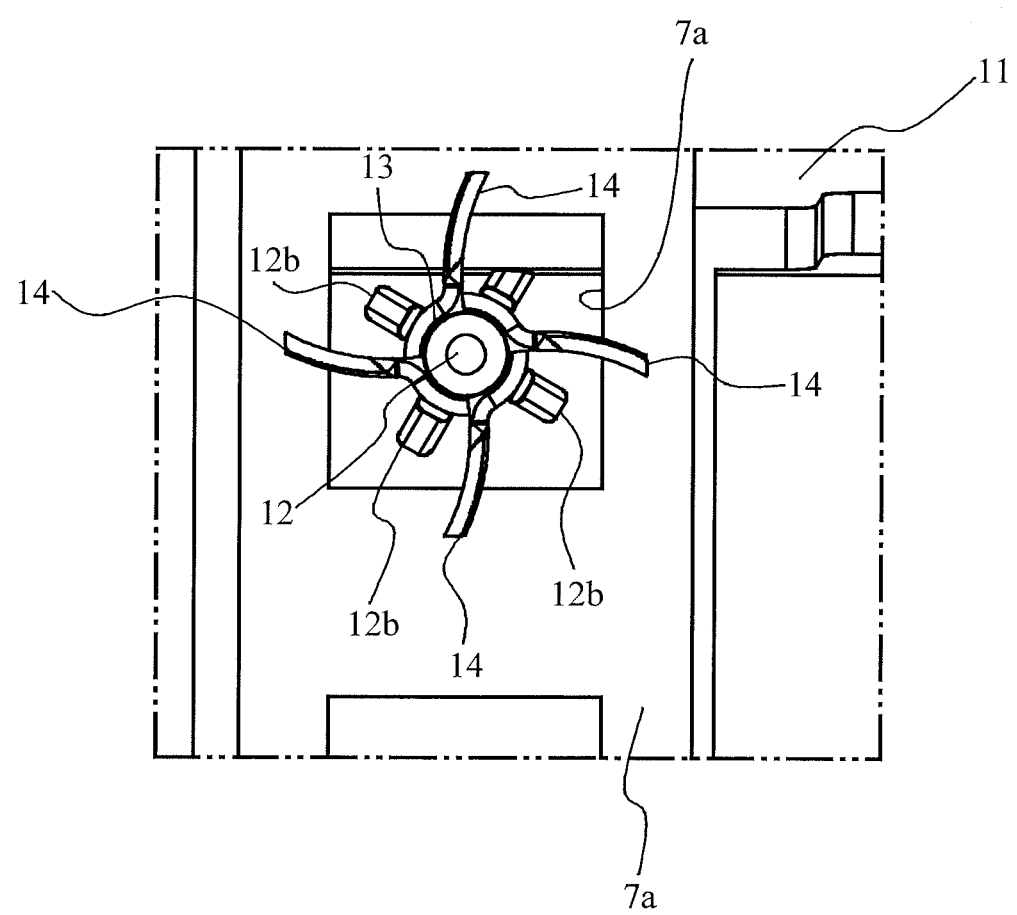
FIG. 13 is an explanatory diagram of a state where the fixing member is inserted into the fixing hole, viewed from a back side of the concealing panel body.
Figure 14:
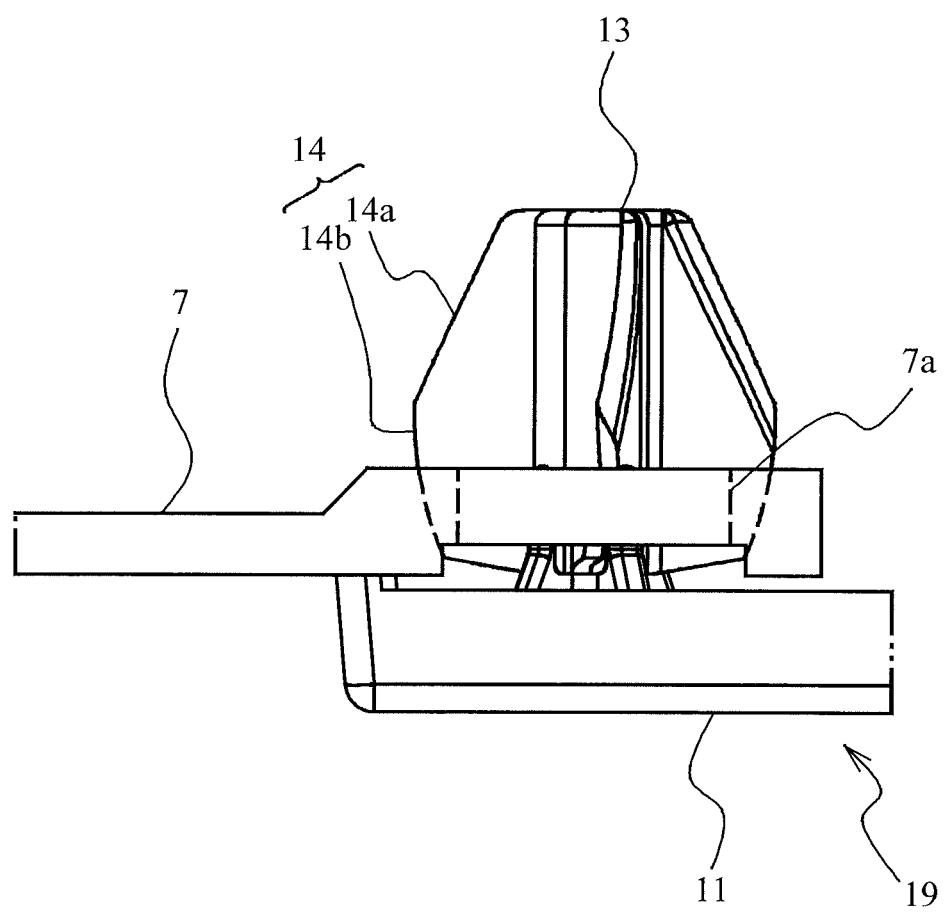
FIG. 14 is an explanatory diagram of a state where the fixing member is inserted into the fixing hole.

FIG. 11 is an explanatory diagram of a state where the fixing member 13 is attached to the concealing panel body 11. FIG. 12 is a perspective view of the fixing member 13 attached to the concealing panel body 11. FIG. 13 is an explanatory diagram of a state where the fixing member 13 is inserted into the fixing hole 7a1, viewed from the back side of the concealing panel body 11. FIG. 14 is an explanatory diagram of a state where the fixing member 13 is inserted into the fixing hole 7a1.

The concealing panel 19 formed by attaching the fixing member 13 to the concealing panel body 11 is fixed to the mount pole 7a provided in the rack 7 in the same manner as the concealing panel 9 of the first embodiment illustrated in FIG. 7.

To achieve such a state, the concealing panel body 11 provided with the boss 12 on the back side thereof and the fixing member 13 are prepared, and the state illustrated in FIG. 11 and FIG. 12 is achieved by attaching the fixing member 13 to the boss 12. After that, the position of the boss 12 to which the fixing member 13 is attached is aligned with the position of the desired fixing hole 7a1, and the vane portion 14 is pushed while being deformed. According to this, it is possible to fix the concealing panel 19 to the mount pole 7a easily as illustrated in FIG. 13 and FIG. 14.

That is to say, if only a state where vane portions 14 (deformation portion) to be inserted into the fixing hole 7a1 are provided on the back side of the concealing panel 19 is achieved, it is only necessary to push vane portions 14 into the fixing hole 7a1 with deforming vane portions 14. When this operation is carried out to four corners of the concealing panel body 11, the fixing operation of the concealing panel 19 is completed. If vane portions 14 are made to stay in the fixing hole 7a1, the fixed state of the concealing panel 19 is maintained.

As described, if the concealing panel 19 provided with the fixing member 13 is utilized, it is possible to accommodate fixing holes 7a1 of various dimensions and shapes and mount poles 7a of various plate thickness. In addition, it becomes possible to fix and remove the concealing panel 19 by a simple operation without using tools. In addition, the fixing member 13 can be used repeatedly.

In addition, it is expected to suppress the misalignment in fixing and the backlash because vane portions 14 can be deformed to fit the shape of the fixing hole 7a1. In addition, vane portions 14 are expected to maintain the stable fixing state by absorbing the vibration energy with the characteristics of the material used for it, converting the vibration energy to the deformation energy which carries out the deformation and the restoration instantaneously, and using it.

[Third Embodiment]

A description will now be given of a third embodiment. The third embodiment is different from the first embodiment in that a fixing member 23 is applied instead of the fixing member 3 in the first embodiment.

Figure 15:
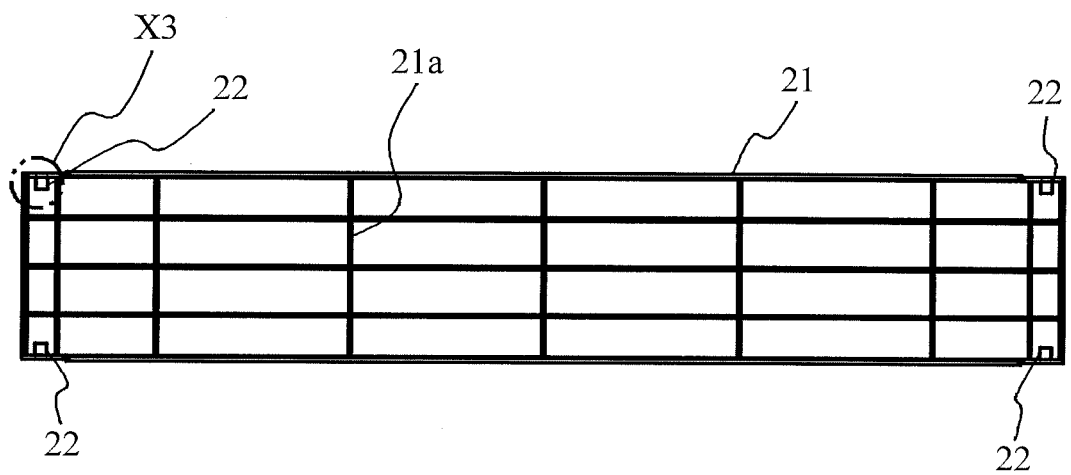
FIG. 15 is a back view of a concealing panel body in accordance with a third embodiment.

FIG. 15 is a back view of a concealing panel body 21 in accordance with the third embodiment. The concealing panel body 21 has a width pitch and a height pitch based on the international standard in the same manner as the concealing panel body 1 of the first embodiment. The concealing panel body 21 includes a lattice-shaped reinforcement rib 21a on its back side. Cap mounting holes 22 are provided to four corners. This is different from first and second embodiments where bosses 2 and bosses 12 are provided.

Figure 16A:
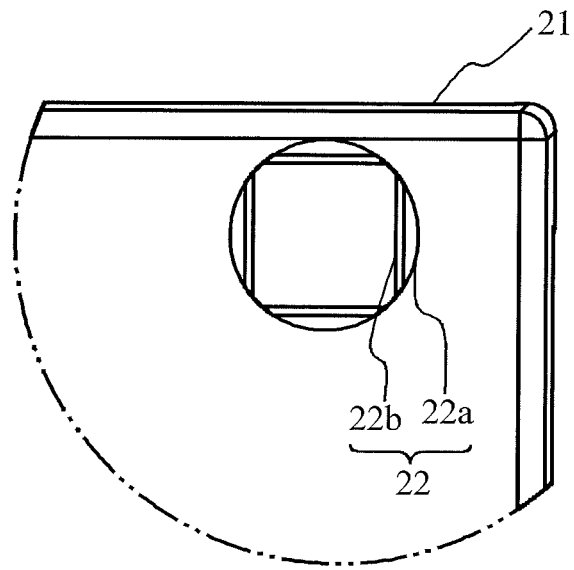
FIG. 16A is an enlarged view of X3 area in FIG. 15 viewed from a front side.
Figure 16B:
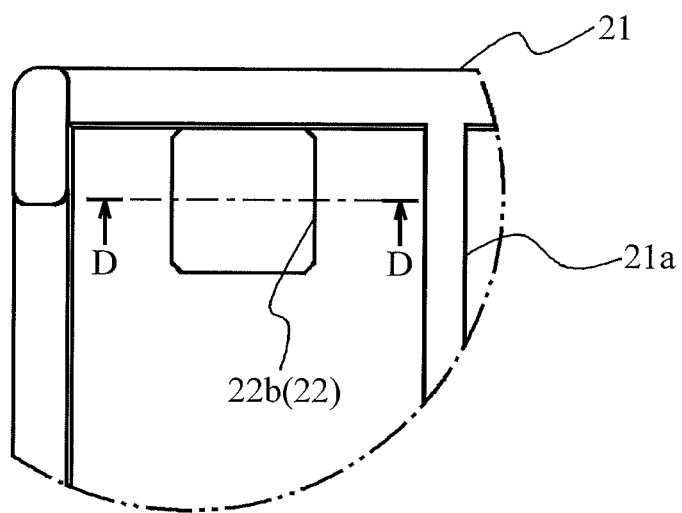
FIG. 16B is an enlarged view of X3 area in FIG. 15 viewed from a back side.
Figure 16C:
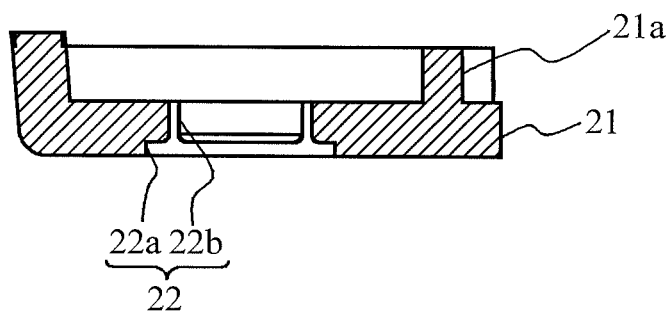
FIG. 16C is a cross-section view taken from line D-D of FIG. 16B.

FIG. 16A is an enlarged view of X3 area in FIG. 15 viewed from the front side. FIG. 16B is an enlarged view of X3 area in FIG. 15 viewed from the back side. FIG. 16C is a cross-section view taken from line D-D of FIG. 16B.

The cap mounting hole 22 includes a circular portion 22a on the front side, and a rectangular portion 22b on the back side. A cap portion 26 provided to the fixing member 23 described later is fit into the circular portion 22a, and a nail-shaped locking portion 27 provided to the fixing member 23 described later is locked to the rectangular portion 22b.

The number of cap mounting holes 22 varies based on the size of the concealing panel body 21. This is same as the number of bosses 2 which varies based on the size of the concealing panel body 1 in the first embodiment.

The fixing member 23 illustrated in FIG. 17A through FIG. 17E is inserted through the cap mounting hole 22, and the cap portion 26 provided to the fixing member 23 is mounted in the cap mounting hole 22.

The fixing member 23 of the third embodiment is different from the fixing member 3 of the first embodiment and the fixing member 13 of the second embodiment in that it may be separated from the concealing panel body 21 till the concealing panel body 21 is fixed to the mount pole 7a. The concealing panel body 21 is fixed to the rack 7 illustrated in FIG. 7 instead of the concealing panel 9 in the first embodiment.

That is to say, the concealing panel 9 where the fixing member 3 is attached to the boss 2 formed together with the concealing panel body 1 as illustrated in FIG. 4 and FIG. 5 in the first embodiment is fixed to the mount pole 7a. On the other hand, in the third embodiment, as described in detail later, in the fixing member 23, the locking portion 27 may be locked to the concealing panel body 21 when fixing the concealing panel body 21 to the mount pole 7a. A description hereinafter will now be given of this case.

Figure 17B:
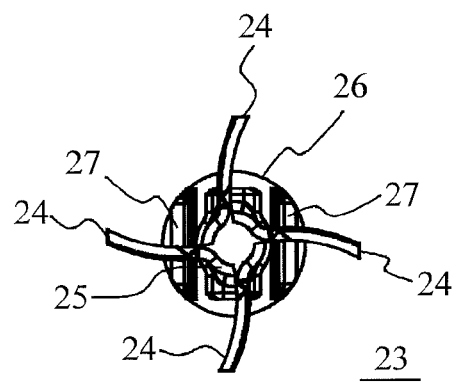
FIG. 17B is a top view of the same.
Figure 17C:
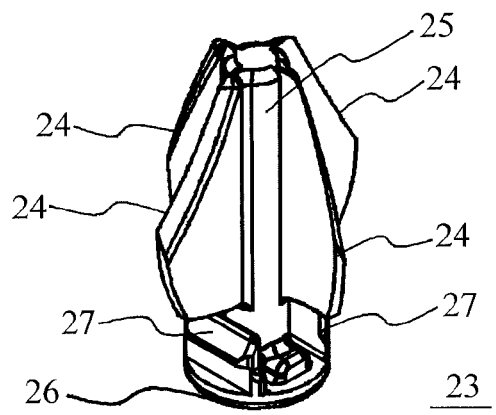
FIG. 17C is a perspective view of the same viewed from a top side.
Figure 17A:
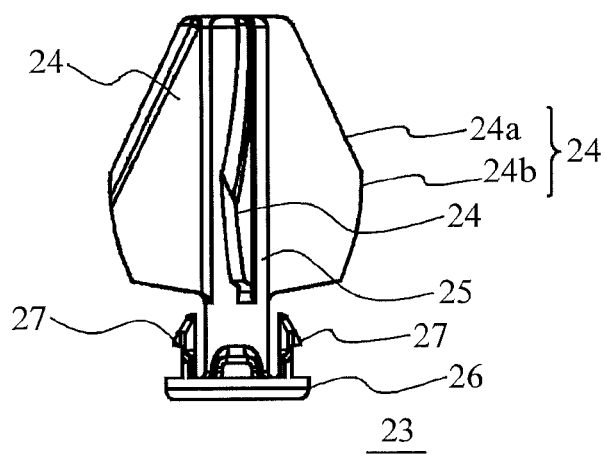
FIG. 17A is a front view of a fixing member in accordance with the third embodiment.
Figure 17D:
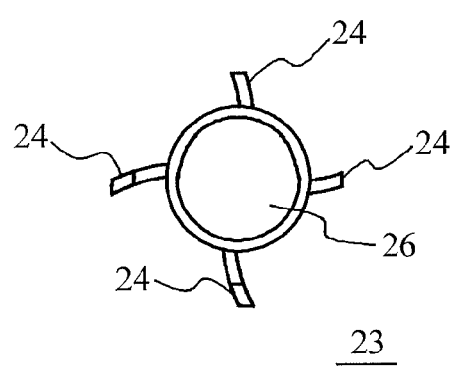
FIG. 17D is a bottom view of the same.
Figure 17E:
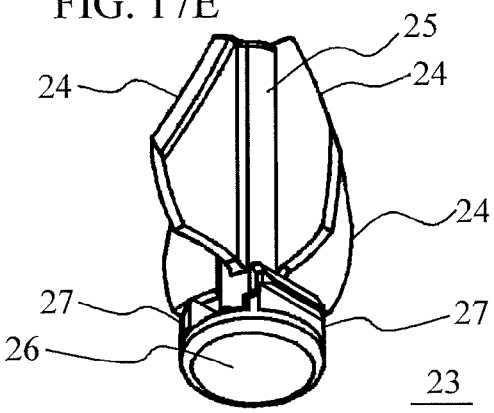
FIG. 17E is a perspective view of the same viewed from a bottom side.

FIG. 17A is a front view of the fixing member 23. FIG. 17B is a top view of the same. FIG. 17C is a perspective view of the same viewed from the top side. FIG. 17D is a bottom view of the same. FIG. 17E is a perspective view of the same viewed from the bottom side.

The fixing member 23 is used when fixing the concealing panel body 21 to the mount pole 7a where fixing holes 7a1 are formed. The fixing member 23 includes vane portions 24 which are inserted into the fixing hole 7a1 while being deformed and stay in the fixing hole 7a1 when fixing the concealing panel body 21 to the mount pole 7a. The vane portion 24 corresponds to a deformation portion of this embodiment.

The vane portion 24 corresponding to the deformation portion is inserted into the fixing hole 7a1 while being deformed. Therefore, it is desirable that the fixing member 23 is formed from a material with good flexibility and good resilience. Elastomer is considered as a material meeting such requirements. The fixing member 23 of this embodiment is formed from silicon. The fixing member 23 includes four vane portions 24 located at even interval as illustrated in FIG. 17A through 17E. Four vane portions 24 are subjected to a shape retention treatment so that they curve in same direction. In addition, the fixing member 23 includes an axis portion 25. The circular cap portion 26 is provided to the base end part of the axis portion 25 as illustrated in FIG. 17A through 17E. In addition, a pair of nail-shaped locking portions 27 extending toward the tip end side and facing each other is provided to the cap portion 26 as apparent in FIG. 17A and FIG. 17C.

Figure 18:
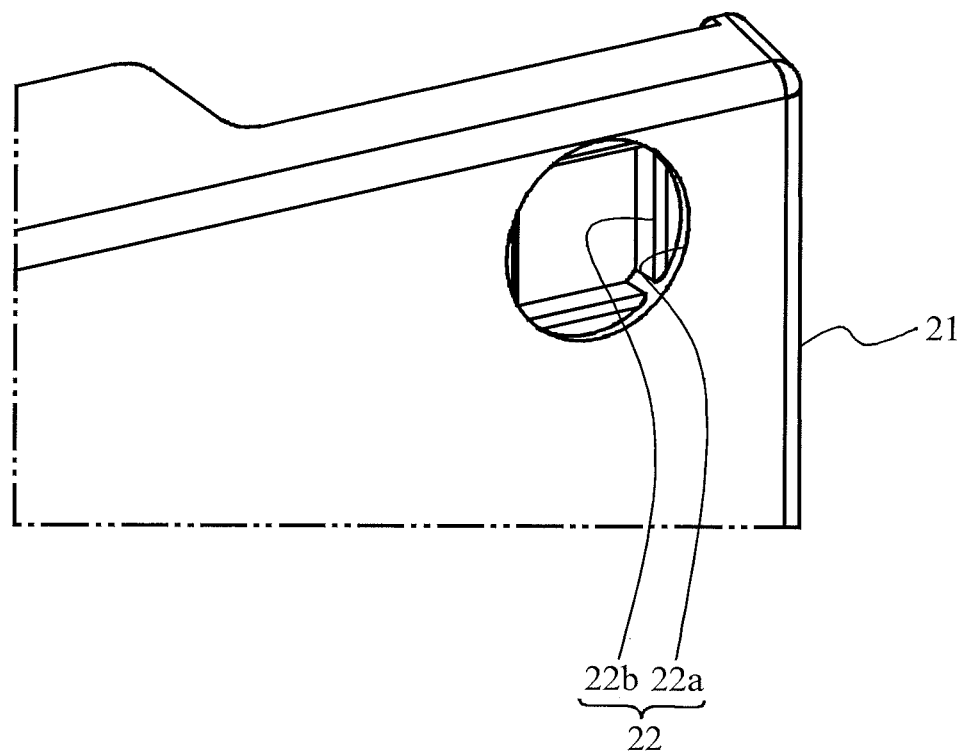
FIG. 18 is an enlarged view of a vicinity of a cap mounting hole provided to the concealing panel body.

FIG. 18 is an enlarged view of a vicinity of the cap mounting hole 22 provided to the concealing panel body 21. The locking portion 27 is locked to the rectangular portion 22b in the cap mounting hole 22. The rectangular portion 22b has a rectangular shape where a direction of each side corresponds to the direction of each side of the concealing panel body 21. The alignment direction of the locking portion 27 locked to the rectangular portion 22b, and directions in which vane portions 24 extend are determined under following consideration. That is to say, the alignment direction of the locking portion 27, and directions in which vane portions 24 extend are determined so that positions of vane portions 24 are not located on diagonal lines of the rectangle of the fixing hole 7a1 when the shape of the fixing hole 7a1 is rectangular. When the shape of the fixing hole 7a1 is rectangular, the length of its diagonal line becomes longer than lengths of sides. Therefore, if vane portions 24 are located on diagonal lines, as they are easily pulled out from fixing holes 7a1, this intends to avoid such a case. As locking portions 27 are locked to the rectangular portion 22b, the rotation of the locking member 23 is stopped.

In the vane portion 24, the width of a base end side portion 24b is wider than the width of a tip end side portion 24a as apparent in FIG. 17A. In addition, the edge line of the tip end side portion 24a slopes so that the width broadens as it comes close to the base end side. When the vane portion 24 is inserted into the fixing hole 7a1, the vane portion 24 is pushed against the fixing hole 7a1 along this slope, and deformed. According to this, the insertion into the fixing hole 7a1 becomes easy. On the other hand, the edge line of the base end side portion 24b slopes so that the width becomes narrow as it comes close to the base end side. It is possible to improve the stability of the concealing panel body 21 fixed to the mount pole 7a. In addition, it is possible to generate a certain level of friction when removing the concealing panel body 21.

Figure 19:
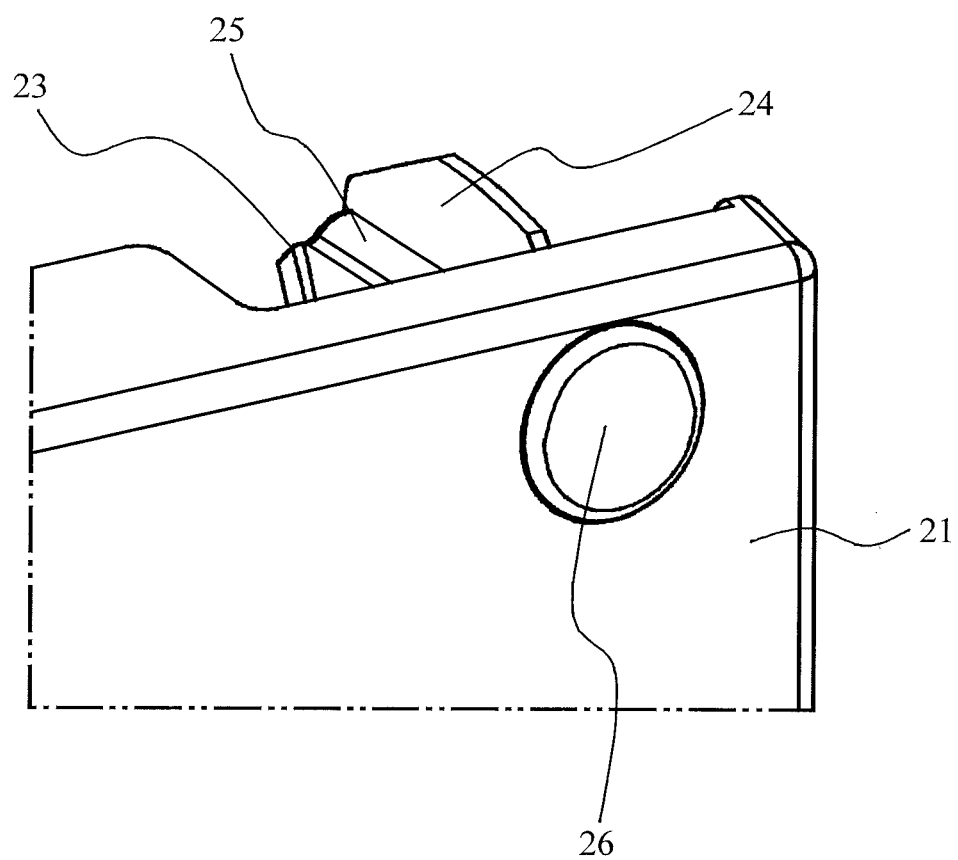
FIG. 19 is a perspective view of a part where the fixing member is attached to the concealing panel body.
Figure 20:
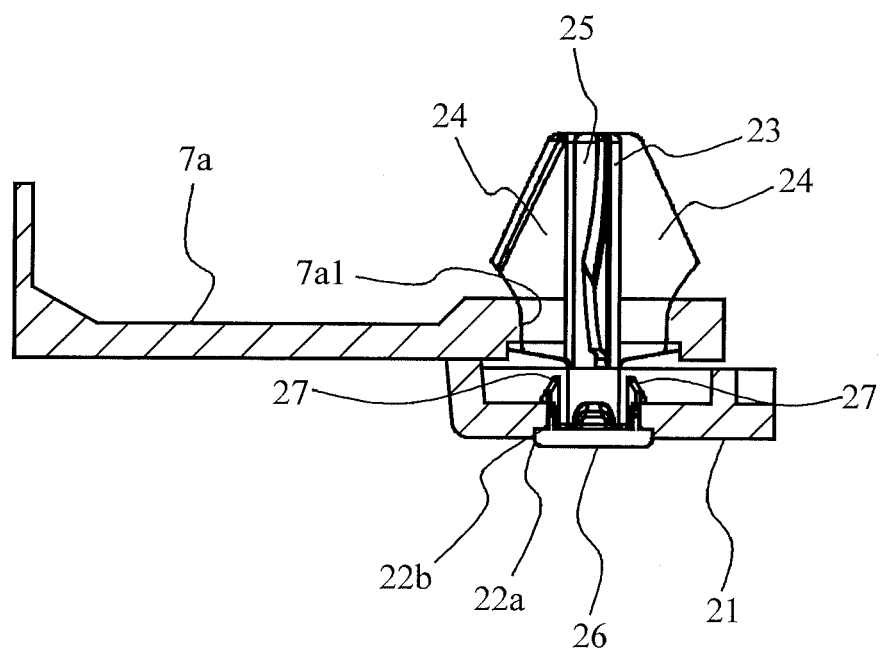
FIG. 20 is an explanatory diagram of a state where the fixing member is inserted into the fixing hole.
Figure 21:
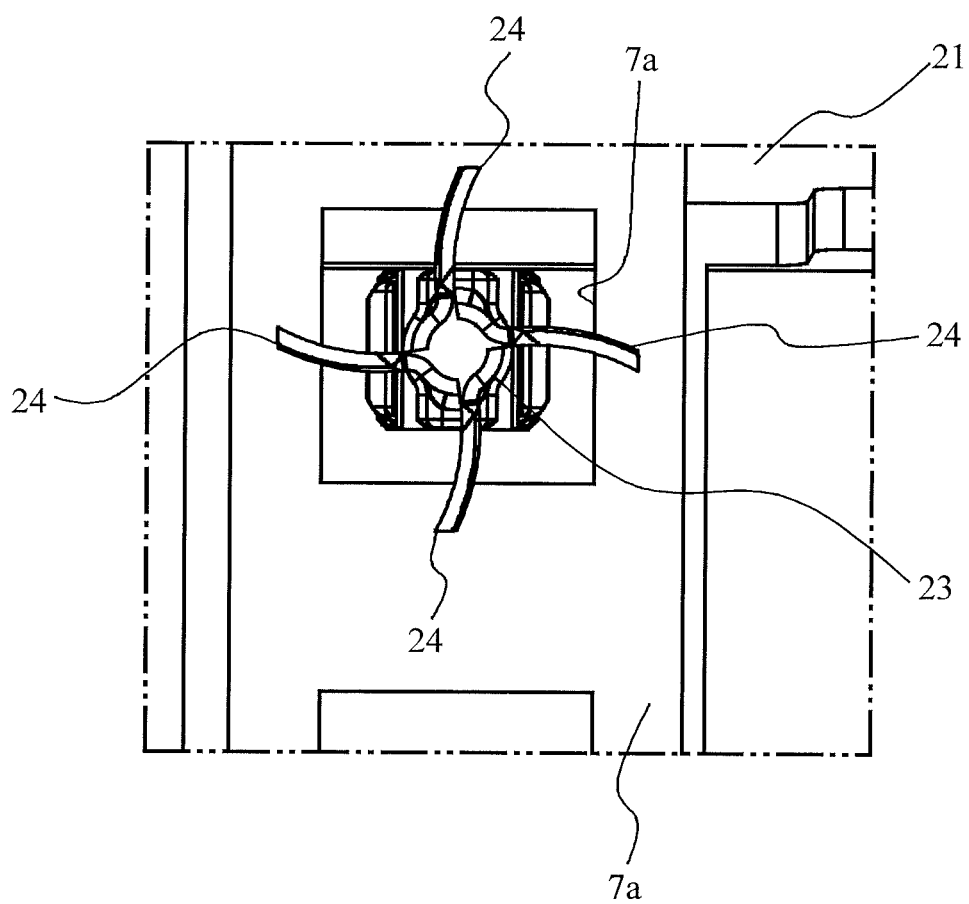
FIG. 21 is an explanatory diagram of a state where the fixing member is inserted into the fixing hole, viewed from a back side of the concealing panel body.

FIG. 19 is a perspective view of the part where the fixing member 23 is attached to the concealing panel body 21. FIG. 20 is an explanatory diagram of a state where the fixing member 23 is inserted into the fixing hole 7a1. FIG. 21 is an explanatory diagram of a state where the fixing member 23 is inserted into the fixing hole 7a1, viewed from the back side of the concealing panel body 21.

The concealing panel body 21 is fixed to the mount pole 7a provided to the rack 7 by using the fixing member 23.

When fixing the concealing panel body 21 to the mount pole 7a, an operator roughly aligns the position of the cap mounting hole 22 with the target position of the fixing hole 7a1, and inserts the fixing member 23 into the cap mounting hole 22 and the fixing hole 7a1. At this time, the operator can carry out the fixing operation while visually checking the position of the fixing hole 7a1 from the cap mounting hole 22. The operator pushes the cap portion 26 into the circular portion 22a of the cap mounting hole 22 eventually. Here, when the cap portion 26 is not fit in the circular portion 22a well, the operator can confirm that the insertion of the fixing member 23 is not completed.

When this operation is carried out to four corners of the concealing panel body 21, the fixing operation of the concealing panel body 21 is completed. The fixed state of the concealing panel body 21 is maintained if the vane portion 24 is made to stay in the fixing hole 7a1.

The operator may attach the fixing member 23 to the cap mounting hole 22 in advance, and fix the concealing panel body 21, to which the fixing member 23 is attached, to the mount pole 7a. That is to say, if only a state where vane portions 24 (deformation portion) inserted into the fixing hole 7a1 are provided on the back side of the concealing panel body 21 is achieved, the operator only needs to push vane portions 24 into the fixing hole 7a1 with deforming them. If this operation is carried out to four corners of the concealing panel body 21, the fixing operation of the concealing panel body 21 is completed. If vane portions 24 are made to stay in the fixing hole 7a1, the fixed state of the concealing panel body 21 is maintained.

As described above, it is possible to carry out the fixing of the concealing panel body 21 so as to accommodate fixing holes 7a1 of various dimensions and shapes and mount poles 7a of various plate thickness by using the fixing member 23. In addition, it becomes possible to fix and remove the concealing panel body 21 by a simple operation without using tools. In addition, the fixing member 23 can be used repeatedly.

In addition, as the vane portion 24 can be deformed to fit the shape of the fixing hole 7a1, it is expected to suppress the misalignment in fixing and the backlash. In addition, the vane portion 24 is expected to maintain the stable fixing state by absorbing the vibration energy with the characteristics of the material used for it, converting the vibration energy into the deformation energy which carries out the deformation and the restoration instantaneously, and using it.

In above-described embodiments, the shape of the fixing hole 7a1 is rectangular, but even though the shape of the fixing hole is other shapes, the concealing panel body can be fixed to the mount pole by using fixing members of above embodiments.

Figure 22A:
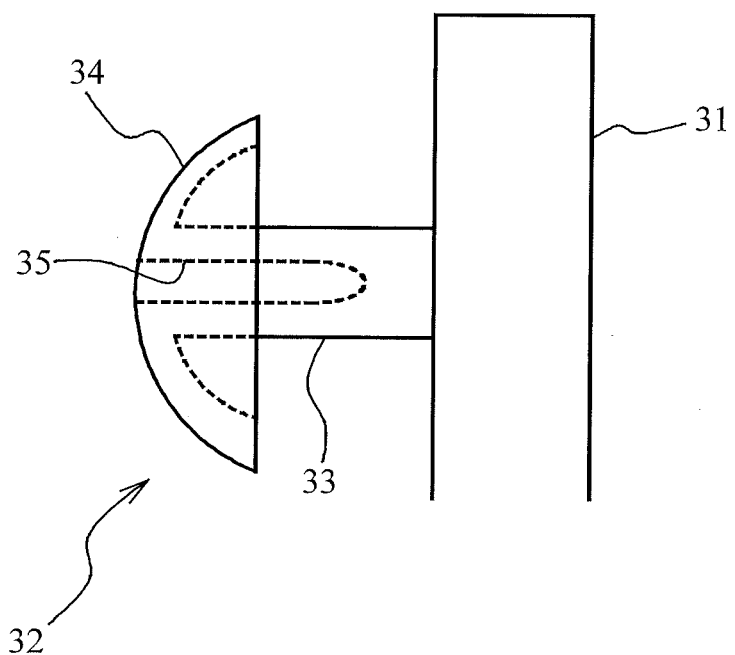
FIG. 22A is a side view of a fixing member of another embodiment.
Figure 22B:
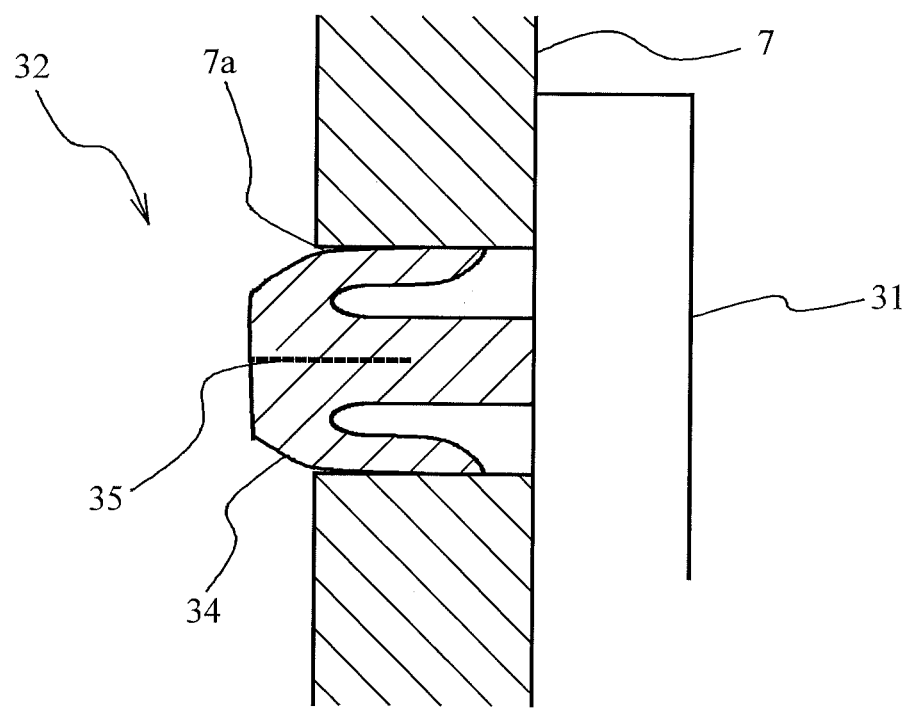
FIG. 22B is an explanatory diagram of a state where the fixing member is inserted into the fixing hole.

In addition, the fixing member 32 including a shade-shaped portion 34 illustrated in FIG. 22A can be applied as a deformation portion, for example. In the fixing member 32, the shade-shaped portion 34 which spreads toward the base end side from the tip end side which is inserted into the fixing hole 7a1 first and can be deformed is provided in the tip end side of an axis portion 33. The base end side of the axis portion 33 is attached to a concealing panel body 31. The fixing member 32 includes a hole 35 which increases the deformation degree of the shade-shaped portion 34 at its center part. It is desirable that the fixing member 32 is formed from a material with good flexibility and good resilience as is the cases with above embodiments, and it may be formed from silicon and the like. When the operator inserts the shade-shaped portion 34 into the fixing hole 7a1 and makes it stay as illustrated in FIG. 22B, the shade-shaped portion 34 generates a frictional force against the inner peripheral surface of the fixing hole 7a1 by the force trying to return to its original shape, and the concealing panel can be fixed to the mount pole 7a.

Figure 23:
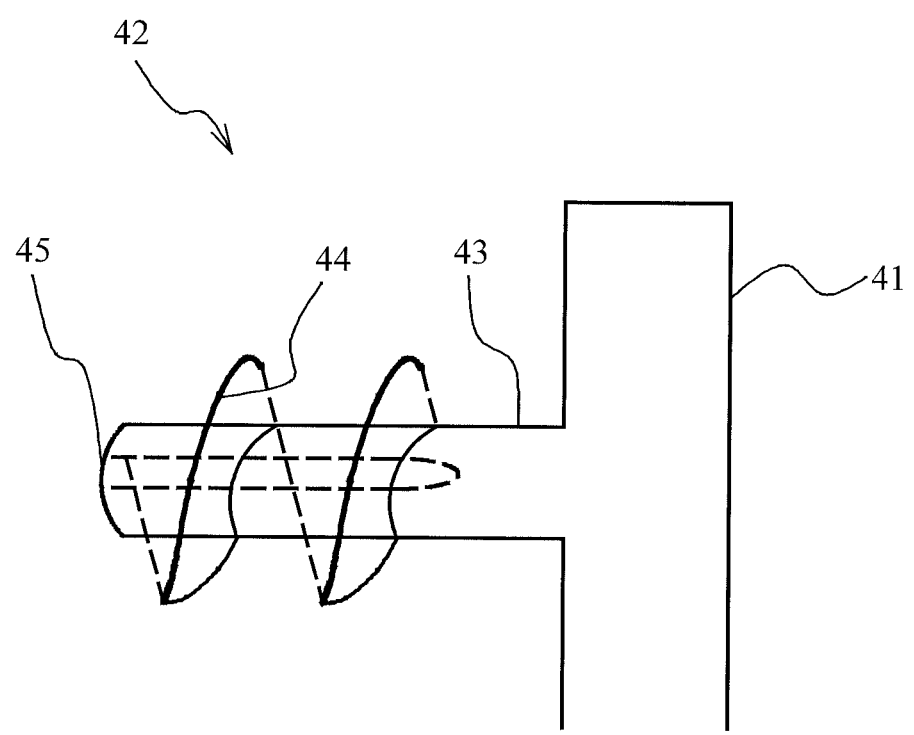
FIG. 23 is a side view of a fixing member of another embodiment.

In addition, a fixing member 42 including a helical flange portion 44 illustrated in FIG. 23 may be applied as a deformation portion, for example. The fixing member 42 includes the helical flange portion 44 along the outer peripheral surface of an axis portion 43. The base end side of the axis portion 43 is attached to a concealing panel body 41. The fixing member 42 includes a hole 45 which increases the deformation degree of the flange portion 44 at its center part. It is desirable that the fixing member 42 is formed from a material with good flexibility and good resilience as is the cases with above embodiments, and it may be formed from silicon and the like. When the operator inserts the flange portion 44 into the fixing hole 7a1, and makes it stay, a frictional force with the inner peripheral surface of the fixing hole 7a1 by the force trying to return to its original shape is generated, and the concealing panel can be fixed to the mount pole 7a. Such fixing member 42 can accommodate the case where the plate thickness of the mount pole 7a is thick, by setting the length of the axis portion 43 long.

In addition, the fixing member may be used in a case other than the mounting of the concealing panel. That is to say, it can be utilized when fixing an object to be fixed to the object to which the object to be fixed is fixed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various change, substitutions, and alterations could be made hereto without departing from the spirit and scope of the invention.

What is claimed is:

1. A fixing member for fixing a blindfold plate to a support post where a rectangular-shaped fixing hole is formed, the fixing member comprising:
    a deformation portion that is attached to the blindfold plate, and is inserted in to the rectangular-shaped fixing hole while being deformed and stays in the rectangular-shaped fixing hole in a deformed condition when the blindfold plate is fixed to the support post; and
    a locking portion that is attached to a cap portion mounted in a cap mounting hole provided to the blindfold plate, for locking the deformation portion;
    wherein the deformation portion includes four vane portions separated from each other,
    wherein the deformation portion is locked by the locking portion so that each of the vane portions contacts each of four edges of the rectangular-shaped fixing hole.

2. A casing to which an electronic device is installed, the casing comprising:
    a blindfold plate;
    a support post in which a rectangular-shaped fixing hole is formed and to which the blindfold plate is fixed; and
    a fixing member that includes a deformation portion attached to the blindfold plate, that is inserted into the rectangular-shaped fixing hole while being deformed and stays in the rectangular-shaped fixing hole in a deformed condition when the blindfold plate is fixed to the support post, and a locking portion that is attached to a cap portion mounted in a cap mounting hole provided to the blindfold plate, for locking the deformation portion;
    wherein the deformation portion includes four vane portions separated from each other,
    wherein the deformation portion is locked by the locking portion so that each of the vane portions contacts each of four edges of the rectangular-shaped fixing hole.

3. A method of fixing a blindfold plate that fixes a blindfold plate to a support post where a rectangular-shaped fixing hole is formed by using a fixing member that includes a deformation portion attached to the blindfold plate, and a locking portion that is attached to a cap portion mounted in a cap mounting hole provided to the blindfold plate, for locking the deformation portion, the deformation portion including four vane portions separated from each other, the method of fixing the blindfold plate comprising:
    pushing the fixing member into the rectangular-shaped fixing hole while the deformation portion of the fixing member is deformed; and
    causing the deformation portion of the fixing member to stay in the rectangular-shaped fixing hole
    wherein the deformation portion is locked by the locking portion so that each of the vane portions contacts each of four edges of the rectangular-shaped fixing hole.

4. A fixing member for fixing a blindfold plate to a support post where a rectangular-shaped fixing hole is formed, the fixing member comprising:
    a deformation portion that is attached to the blindfold plate, and is inserted in to the rectangular-shaped fixing hole while being deformed and stays in the rectangular-shaped fixing hole in a deformed condition when the blindfold plate is fixed to the support post; and
    a locking notch portion that is provided to a base of the deformation portion and attached to a reinforcement portion provided to a base portion of a boss provided to the blindfold plate, for locking the deformation portion;
    wherein the deformation portion includes four vane portions separated from each other,
    wherein the deformation portion is locked by the locking notch portion so that each of the vane portions contacts each of four edges of the rectangular-shaped fixing hole.

5. A casing to which an electronic device is installed, the casing comprising:
    a blindfold plate;
    a support post in which a rectangular-shaped fixing hole is formed and to which the blindfold plate is fixed; and
    a fixing member that includes a deformation portion attached to the blindfold plate, that is inserted into the rectangular-shaped fixing hole while being deformed and stays in the rectangular-shaped fixing hole in a deformed condition when the blindfold plate is fixed to the support post, and a locking notch portion that is provided to a base of the deformation portion and attached to a reinforcement portion provided to a base portion of a boss provided to the blindfold plate, for locking the deformation portion;

wherein the deformation portion includes four vane portions separated from each other, wherein the deformation portion is locked by the locking notch portion so that each of the vane portions contacts each of four edges of the rectangular-shaped fixing hole.

6. A method of fixing a blindfold plate that fixes a blindfold plate to a support post where a rectangular-shaped fixing hole is formed by using a fixing member that includes a deformation portion attached to the blindfold plate, and a locking notch portion that is provided to a base of the deformation portion and attached to a reinforcement portion provided to a base portion of a boss provided to the blindfold plate, for locking the deformation portion, the deformation portion including four vane portions separated from each other, the method of fixing the blindfold plate comprising:

pushing the fixing member into the rectangular-shaped fixing hole while the deformation portion of the fixing member is deformed; and causing the deformation portion of the fixing member to stay in the rectangular-shaped fixing hole wherein the deformation portion is locked by the locking notch portion so that each of the vane portions contacts each of four edges of the rectangular-shaped fixing hole.

\* \* \* \* \*